United States Patent
Gries

(10) Patent No.: US 9,686,823 B2
(45) Date of Patent: Jun. 20, 2017

(54) ELECTRIC HEATER

(71) Applicant: MAHLE International GmbH, Stuttgart (DE)

(72) Inventor: Jean-Philippe Gries, Colmar (FR)

(73) Assignee: MAHLE International GmbH, Stuttgart (DE)

( * ) Notice: Subject to any disclaimer, the term of this patent is extended or adjusted under 35 U.S.C. 154(b) by 198 days.

(21) Appl. No.: 14/556,860

(22) Filed: Dec. 1, 2014

(65) Prior Publication Data

US 2015/0156822 A1  Jun. 4, 2015

(30) Foreign Application Priority Data

Dec. 3, 2013 (EP) ...................................... 13290298

(51) Int. Cl.
| | |
|---|---|
| *H05B 3/04* | (2006.01) |
| *H05B 3/50* | (2006.01) |
| *F24H 3/04* | (2006.01) |
| *H05K 1/11* | (2006.01) |
| *H01R 12/72* | (2011.01) |
| *H01R 13/11* | (2006.01) |

(52) U.S. Cl.
CPC ............. *H05B 3/50* (2013.01); *F24H 3/0429* (2013.01); *F24H 3/0435* (2013.01); *F24H 3/0447* (2013.01); *H05B 3/04* (2013.01); *H05K 1/117* (2013.01); *H01R 12/721* (2013.01); *H01R 12/722* (2013.01); *H01R 13/113* (2013.01); *H05B 2203/023* (2013.01); *H05K 2201/10386* (2013.01)

(58) Field of Classification Search
CPC .... H01R 12/721; H01R 12/722; H01R 13/11; H01R 13/112; H01R 13/113; H05B 3/03; H05B 3/06; H05B 3/50; H05B 2203/023
See application file for complete search history.

(56) References Cited

U.S. PATENT DOCUMENTS 2,937,357 A * 5/1960 Kennedy .............. H01R 12/721 439/633
3,131,017 A * 4/1964 Mittler ................. H01R 12/721 439/857

(Continued)

FOREIGN PATENT DOCUMENTS

| DE | 10 2009 032621 A1 | 1/2010 |
|---|---|---|
| EP | 1 143 564 A1 | 10/2001 |

(Continued)

OTHER PUBLICATIONS

European Search Report, EP 2881679A1, Apr. 8, 2014.*

*Primary Examiner* — Joseph M Pelham
(74) *Attorney, Agent, or Firm* — Muncy, Geissler, Olds & Lowe, P.C.

(57) ABSTRACT

An electric heater for an automobile vehicle, with at least one heating element and with at least one circuit board, whereby the circuit board has at least one contact area through which an electrical connection between a heating element and a power supply can be realized. The heating element has at least one PTC-heating element, whereby the heating element can be clipped to the circuit board via a connector clip, and whereby the connector clip has two flexible extensions, which are arranged opposed to each other.

11 Claims, 1 Drawing Sheet

(56) References Cited

U.S. PATENT DOCUMENTS

| | | | | |
|---|---|---|---|---|
| 3,133,780 | A * | 5/1964 | Dean | H01R 12/721 |
| | | | | 439/857 |
| 3,289,148 | A * | 11/1966 | Antes | H01R 12/721 |
| | | | | 439/637 |
| 3,601,775 | A * | 8/1971 | Longenecker | H01R 12/721 |
| | | | | 439/636 |
| 3,764,955 | A * | 10/1973 | Ward | H05K 3/366 |
| | | | | 439/377 |
| 4,707,591 | A * | 11/1987 | Sprenger | H05B 3/06 |
| | | | | 200/61.78 |
| 4,862,326 | A * | 8/1989 | Blomstedt | H05K 7/1457 |
| | | | | 361/622 |
| 7,394,044 | B2 * | 7/2008 | Brun | F24H 3/0405 |
| | | | | 219/541 |
| 8,182,299 | B2 * | 5/2012 | Schrader | H01R 13/113 |
| | | | | 439/857 |
| 8,803,036 | B2 * | 8/2014 | Niederer | H01R 9/091 |
| | | | | 219/202 |
| 2003/0180033 | A1 * | 9/2003 | Alban | F24H 3/0429 |
| | | | | 392/347 |
| 2004/0112884 | A1 * | 6/2004 | Uhl | B60H 1/034 |
| | | | | 219/202 |
| 2005/0092737 | A1 * | 5/2005 | Brun | F24H 3/0429 |
| | | | | 219/541 |
| 2005/0173394 | A1 * | 8/2005 | Bohlender | H01H 37/76 |
| | | | | 219/202 |
| 2007/0295706 | A1 * | 12/2007 | Brun | B60H 1/2225 |
| | | | | 219/202 |
| 2009/0020515 | A1 * | 1/2009 | Clade | F24H 3/0405 |
| | | | | 219/202 |
| 2013/0161306 | A1 * | 6/2013 | Bohlender | H05B 3/02 |
| | | | | 219/202 |
| 2013/0161307 | A1 * | 6/2013 | Bohlender | H05B 3/02 |
| | | | | 219/202 |
| 2013/0161308 | A1 * | 6/2013 | Bohlender | H05B 3/02 |
| | | | | 219/202 |
| 2015/0108111 | A1 * | 4/2015 | Gries | F24H 3/0429 |
| | | | | 219/486 |
| 2015/0108112 | A1 * | 4/2015 | Gries | F24H 3/0429 |
| | | | | 219/486 |
| 2015/0108117 | A1 * | 4/2015 | Gries | B60H 1/2215 |
| | | | | 219/539 |
| 2015/0156820 | A1 * | 6/2015 | Gries | H01C 7/02 |
| | | | | 219/536 |
| 2015/0296566 | A1 * | 10/2015 | Gries | H05B 3/06 |
| | | | | 219/541 |
| 2016/0214463 | A1 * | 7/2016 | Gries | H05B 1/0236 |

FOREIGN PATENT DOCUMENTS

| | | |
|---|---|---|
| EP | 2 017 548 A1 | 1/2009 |
| WO | WO 02/057100 A2 | 7/2002 |

* cited by examiner

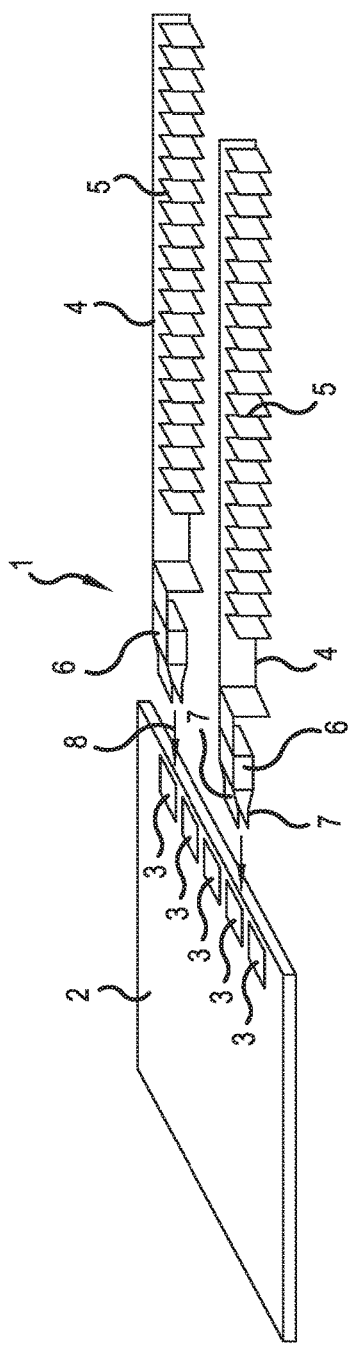
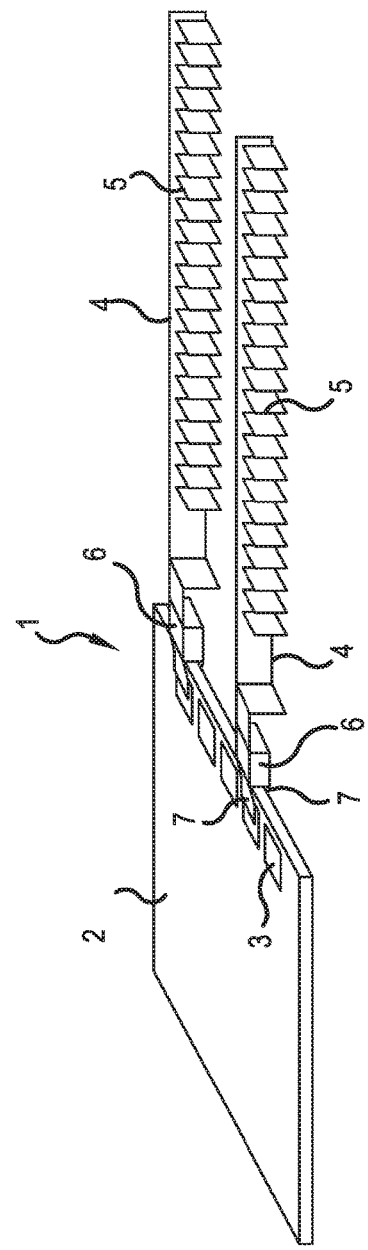

ELECTRIC HEATER

This nonprovisional application claims priority under 35 U.S.C. §119(a) to European Patent Application No. EP13290298.2, which was filed on Dec. 3, 2013, and which is herein incorporated by reference.

BACKGROUND OF THE INVENTION

Field of the Invention

The present invention relates to an electric heater for an automobile vehicle, with at least one heating element and with at least one circuit board, whereby the circuit board possesses at least one contact area through which an electrical connection between a heating element and a power supply can be realized, whereby the heating element has at least one PTC-heating element.

Description of the Background Art

Electric heaters usually have at least one heating element which can be heated by applying an electric current to the element. The heat is then transported via fins or other thermally conductive parts to a heat sink. The heat sink can thus be heated by the heating element. To control the electric current on the heating element electric heaters also possess a control unit.

Electric heaters known in the conventional art have a connection assembly between the heating elements and the control unit and/or the power supply. The connection assembly is usually built of a male connector and a female connector. Due to the nature of such a connection assembly the electric heater is exposed to mechanical stress while the connectors are being connected.

Furthermore the connection assembly can be exposed to corrosion, humidity or mechanical stress due to its location within the electric heater. Especially, if the individual heating elements are connected by a connection assembly to a common bus-system, which is connected to a power supply, the assembling of every heating element will cause mechanical stress to all the other already assembled heating elements. This can lead to damage within the connection assemblies or the heating elements.

Furthermore it is difficult to achieve a connection assembly that is sufficiently sealed off against water or more general humidity. Especially the area around the connector in or at a housing is critical, as water or humidity can leak through the joint-area between the connector and the housing.

An entry of water or humidity in general can lead to fretting corrosion and hence to failure of the electric heater. Due to the environment in which such electric heaters are usually used, the connector has to fulfill a high level of requirements over the full lifetime to prevent failure. Electric heaters of this kind are usually used within automobile vehicles to support the heating of the engine or the interior of the vehicle.

SUMMARY OF THE INVENTION

It is therefore an object of the present invention to provide an electric heater which has an improved connection between a heating element and a circuit board of the electric heater, whereby the connection can be obtained with a minimum of mechanical stress to the electric heater. Furthermore the electric heater should be easily producible.

According to an embodiment of the invention an electric heater for an automobile vehicle is given, with at least one heating element and with at least one circuit board, whereby the circuit board has at least one contact area through which an electrical connection between a heating element and a power supply can be realized, whereas the heating element possesses at least one PTC-heating element, whereby the heating element can be clipped to the circuit board via a connector clip, whereby the connector clip possesses two flexible extensions, which are arranged opposed to each other.

A connector clip is advantageous as it can be placed on the circuit board without the need for additional tools. Furthermore the clip can be slipped over the circuit board without the need to have big assembly forces. Therefore the mechanical stress for other connections and elements of the circuit board or the electric heater is very limited. The connector clip has two flexible extensions which can be deflected by the circuit board with a reasonable force. The deflection creates a contact pressure, which helps to fix the connector at the circuit board and thus stabilizes the connection. Depending on the material of the flexible extensions the connector can be used to create a physical connection between the heating element and the circuit board and possibly to create an electrical connection between the heating element and the contact area of the circuit board. This helps to reduce the amount of needed parts and reduces the complexity of the electric heater.

The connection of the heating element directly to the circuit board is advantageous as no further elements are needed. Especially bus bars, which are usually connected to all the heating elements of the electric heater, are not needed. The bus bars are usually used to connect the heating elements to a control unit and/or a power supply. By connecting the contact areas of the circuit board directly to a power supply and connecting the heating elements directly to the circuit board, a simpler build-up of the electric heater can be achieved.

According to an embodiment of the invention, the distance between the two flexible extensions is smaller than the height of the plate-shaped circuit board in the zone of the contact area.

Through a distance between the flexible extensions, especially between the closest points of the flexible extensions, which is smaller than the height of the circuit board, a contact pressure between the circuit board and the flexible extensions can be produced by inserting the circuit board in the connector clip. This contact pressure helps to stabilize the connection between the connector clip and the circuit board, as it works against relative movement of the circuit board against the connector clip.

In a further embodiment, the connector clip forms a U-shaped cross-section, which forms a receiving area, whereby the circuit board can be inserted into the receiving area.

The U-shaped cross-section is beneficial as it provides an opening through which the circuit board can be inserted in the connector clip. The flanks of the U-shaped cross-section are formed by the flexible extensions. The U-shaped cross-section can be expanded by a deflection of the flexible extensions away from each other or narrowed by a deflection of the flexible extensions towards each other. The deflection of the flexible extensions depends predominantly on the height of the plate-shaped circuit board. The circuit board can have a height between 0.5 mm and 2 mm, whereby the height can be between 1 mm and 1.6 mm. A bigger height of the circuit board results in a bigger deflection whereas a smaller height results in a smaller deflection.

The flexible extensions can have an arched cross-section. The arched design can help the process of inserting the circuit board in the receiving area, as the arched design creates an opening at the top of the U-shaped cross-section, which narrows down with a growing distance from the opening. Besides that the arched design creates a contact pressure transmitting area which is much smaller than the cross-section area of complete receiving area. This results in a higher contact force in the contact pressure transmitting area.

A force can be created by the insertion of the circuit board into the receiving area of the connector clip, whereby the force creates contact pressure between the contact area and the flexible extensions.

Through such a force the stability of the connection between the connector clip and the circuit board can be improved as the contact pressure between the connector clip and the circuit board works against any relative movement between the connector clip and the circuit board. Thus higher forces are needed to pull the connector clip away from the circuit board, which makes an unintentional release unlikely.

Also, at least one of the flexible extensions can be electrically conductive. This is advantageous as the electrical connection between the heating element and the contact area or between the PTC-heating element and the contact area can be achieved directly through the connector clip. This is beneficial as no additional parts are needed.

Besides this, it is preferable in an embodiment, if the PTC-heating element is electrically connectable to the contact area by the heating element and/or the connector clip.

The PTC-heating element can either be connected to the connector clip by the heating element itself which can have electrically conductive capabilities or by an additional element such as an electric bridge or a cable. Through this electrical connection it is possible to connect the PTC-heating element to a power supply. By applying an electrical current to the PTC-heating element heat can be generated, which can be radiated from the PTC-heating elements and/or the heat transmitting fins and/or the heating element.

Furthermore, the contact area of the circuit board can be coated with an electrically conductive material. An electrically conductive material can be for instance tin, copper, brass, silver, an alloy of the afore mentioned or the like. A coating of the contact area and the connector clip with an identical electronically conductive coating is especially advantageous to reach a better material compatibility between the involved elements. Especially the connector clip can be made from or coated with a conductive material like the before mentioned materials.

In an embodiment, the contact area and/or the circuit board and/or the connector clip can be covered by an electrical insulation and/or an insulation against fluid leakage and/or an insulation against mechanical stress.

An insulation against short-circuits, fluid leakage or mechanical stress is advantageous to prevent failures. Insulations of these kinds can for instance be realized by membranes or foils, which are spread over the specific area. An insulation can be installed on the circuit board especially after the connector clips have been connected to the circuit board. The insulation can advantageously cover the contact area as well as the connector clips. This results in a better insulation against humidity or short-circuits in the area of the electrical contact between the circuit board and the connector clip.

Besides this it is preferable, if the circuit board and/or the contact area of the circuit board is electrically connected to at least one pole of a power supply.

Via a connection between the circuit board and a pole of a power supply the power supply of the heating element or more specific the power supply of the PTC-heating element can be realized. In an embodiment, the contact area can be electrically connected to the connector clip, while the connector clip is either electrically connected to the PTC-heating element itself or to the heating element, which in turn can be electrically connected to the PTC-heating element. In an advantageous embodiment of the invention the PTC-heating elements are connected to at least one pole of a power supply by one heating element and furthermore connected to a second pole of a power supply or to the ground by a second heating element, which is adjacent to it, to create a closed circuit, which allows the PTC-heating elements to be heated. The connection between the PTC-heating element and the poles of the power supply can be realized through electrically conductive elements such as the heat transmitting fins or the heating elements or additional conductive elements such as bridges or cables.

Furthermore, the circuit board can be encased partially or in full extent in a housing. A housing, preferably a waterproof housing, is beneficial to create an insulated environment around the circuit board. The housing can encase only the part of the circuit board where the contact areas are located or in an alternative the complete circuit board. Preferably the whole circuit board is encased by the housing. In a preferred embodiment the housing encases the connector clips of the heating elements as well. Such a housing can prevent electric short-circuits and/or fretting corrosion due to humidity. The openings in the housing, which are needed for the heating elements, can be sealed by conventional seals, which are known in the start of the art.

In another embodiment, the heating element can be a planar body which extensions in two of the three spatial directions are larger than the extension in the third spatial direction, whereby the PTC-heating element is connected to one side of the heating element and one or more fins are connected to the opposed side of the heating element.

Such a design of the heating element is advantageous as it allows a multitude of PTC-heating elements to be placed alongside each heating element. Due to its relatively short extension in the third spatial direction the temperature resistance along the third spatial direction is relatively low, which helps to improve the overall efficiency of the electric heater. An alternative embodiment can be characterized by PTC-heating elements on both of the opposing sides of the heating. The heat transmitting fins can thereby be placed between the PTC-heating elements and/or directly on top of the PTC-heating elements.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 shows a circuit board with a multitude of contact areas that are electrically connected to a power supply, whereby two heating elements are shown next to the circuit board, whereby each heating element shows one connector clip through which the heating elements can be connected to the circuit board, and FIG. 2 shows the embodiment of FIG. 1, whereby the connector clips of the heating elements are connected to the circuit board via the connector clips.

DETAILED DESCRIPTION

FIG. 1 shows an electric heater 1 with one circuit board 2 and two heating elements 4. Each heating element 4 possesses a multitude of heat transmitting fins 5 and at least one PTC-heating element (not shown in FIG. 1). Each heating element 4 further shows a connector clip 6, which can be used to connect the heating element 4 to the circuit board 2.

The circuit board 2 possesses a multitude of contact areas 3. These contact areas 3 are connected to a power supply that is not shown in FIG. 1. The connection between the contact areas 3 and the power supply can be realized by conducting paths and power switches on the circuit board 2. The circuit board 2 can be a printed circuit board as it is widely known in the state of the art.

The contact areas 3 are located near to one of the edges of the circuit board so that they can easily be covered by the connector clips 6 of the heating elements 4. To cover the contact areas 3 with the connecter clips 6, the connector clips 6 can be plugged over the edge of the circuit board 2 in a way that one of the flexible extensions 7 slips over the circuit board 2 and the other flexible extension 7 slips under the circuit board 2. The flexible extensions 7 in FIG. 1 are arched. The tips of the flexible extensions 7 point away from each other. This design of the connector clip 6 makes it easier to slip the connector clip 6 over the circuit board 2.

The deflection of the flexible extensions 7, which is caused by the circuit board 2 as it has a height that is bigger than the smallest distance between the flexible extensions 7 of one connector clip 6, creates a force that is directed at the circuit board 2 and that creates a contact pressure between the flexible extensions 7 and the circuit board 2. This contact pressure helps to avoid relative movement between the circuit board 2 and the connector clip 6 and thus stabilizes the connection.

Each connector clip 6 can be attached to the circuit board 2 in a way that only one contact area 3 is covered by one connector clip 6. This makes it possible to create a specified electrical connection between one certain contact area 3 and one connector clip 6. As the circuit board 2 is preferably either is a control unit or is connected to a control unit it is possible to activate or deactivate the heating elements 4 individually.

The circuit board 2 can possess contact areas 3 on the upper side, as shown in FIG. 1, and on the lower side. Depending on the conducting paths on the circuit board 2 the contact area/areas 3, that are connected with one specific connector clip 6, can be connected to one pole of a power supply or to two poles (one contact area relative to one connector relative to one pole). Especially if the contact areas 3 are connected to two different poles of a power supply it is easy to create a closed electric circuit that contains the power supply, the conducting paths, the contact areas 3, the connector clip 6, the heating element 4 and the PTC-heating elements, which are arranged alongside the heating element 4 (not shown in FIG. 1). Through a closed electric circuit a PTC-heating element can be operated in a way that heat is produced. In a still further refinement the heating elements or more specific the PTC-heating elements can be connected to a power supply by further components, such as cables or conductive bridge elements.

To plug the connector clips 6 to the circuit board 2 the heating elements 4 must be moved in a direction, which is indicated by the arrow that is marked with the reference number 8.

FIG. 2 shows the embodiment of FIG. 1, whereby the heating elements 4 are connected to the circuit board 2. The connection is created by a lateral movement of the heating elements 4 along the direction 8 of FIG. 1. The connector clips 6 are slipped over the right edge of the circuit board 2. The connector clips 6 embrace the circuit board 2 with the flexible extensions 7. The deflected flexible extensions 7 create a force, which results in a contact pressure between the flexible extensions 7 and the circuit board 2. In an embodiment a multitude of heating elements 4 can be applied to the circuit board. An embodiment has one heating element 4 attached to each contact area 3.

An electric heater can possess a multitude of circuit boards, which can be connected to each other by additional wiring or a circuit board with a multitude of busbars, which are connected to the negative pole and/or the positive pole of a power supply and can be plugged into those connector clips. The system can be arranged within a frame or a housing. The circuit board 2 can be covered with an insulation against humidity and/or mechanical stress and/or electric short-circuits. In another embodiment the circuit board and/or the connector clips are encased in a waterproof housing. Preferably the whole circuit board and especially the area where the electrical connection between the heating elements and the circuit board is created is encased in the housing. This helps to prevent short-circuits and damage due to corrosion.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An electric heater for a vehicle, the electric heater comprising:
    at least one heating element; and
    at least one circuit board having at least one contact area through which an electrical connection between the heating element and a power supply is made,
    wherein the heating element has at least one PTC-heating element,
    wherein the heating element is clipped to the circuit board via a connector clip,
    wherein the connector clip has two flexible extensions that are arranged opposed to each other,
    wherein the circuit board is plate-shaped having a first main surface and a second main surface that opposes the first main surface,
    wherein the at least one contact area is provided on the first main surface of the circuit board, and
    wherein the circuit board is positioned between the two flexible extensions of the connector clip, such that a first one of the two flexible extensions contacts the at least one contact area on the first main surface of the circuit board and a second one of the two flexible extensions contacts the second main surface of the circuit board.

2. The electric heater as claimed in claim 1, wherein a distance between the two flexible extensions is smaller than a height of the circuit board in the zone of the contact area.

3. The electric heater as claimed in claim 1, wherein the connector clip forms a U-shaped cross-section, which forms a receiving area, and wherein the circuit board is insertable into the receiving area.

4. The electric heater as claimed in claim 3, wherein a force is created by the insertion of the circuit board into the receiving area of the connector clip, and wherein the force creates contact pressure between the contact area and the flexible extensions.

5. The electric heater as claimed in claim 1, wherein at least one of the flexible extensions is electrically conductive.

6. The electric heater as claimed in claim 1, wherein the PTC-heating element is electrically connectable to the contact area by the heating element and/or the connector clip.

7. The electric heater as claimed in claim 1, wherein the contact area and/or the circuit board and/or the connector clip is covered by an electrical insulation and/or an insulation against fluid leakage and/or an insulation against mechanical stress.

8. The electric heater as claimed in claim 1, wherein the circuit board and/or the contact area of the circuit board is electrically connected to at least one pole of a power supply.

9. The electric heater as claimed in claim 1, wherein the circuit board is encased in a housing partially or fully.

10. The electric heater as claimed in claim 1, wherein the heating element is a planar body, which extensions in two of three spatial directions are larger than extension in a third spatial direction, and wherein the PTC-heating element is connected to one side of the heating element and one or more fins are connected to an opposite side of the heating element.

11. The electric heater as claimed in claim 1, wherein the second one of the two flexible extensions directly contacts the second main surface of the circuit board and wherein the at least one contact area is provided directly on the first main surface of the circuit board.

* * * * *